US006345125B2

(12) United States Patent
Goyal et al.

(10) Patent No.: US 6,345,125 B2
(45) **Date of Patent: *Feb. 5, 2002**

(54) MULTIPLE DESCRIPTION TRANSFORM CODING USING OPTIMAL TRANSFORMS OF ARBITRARY DIMENSION

(75) Inventors: Vivek K. Goyal, Berkeley, CA (US); Jelena Kovacevic, New York, NY (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,488

(22) Filed: Feb. 25, 1998

(51) Int. Cl.[7] .......................... G06K 9/36; H03M 7/34; H04N 7/12; H04B 1/66; G10L 21/00

(52) U.S. Cl. ....................... 382/251; 382/232; 382/233; 382/234; 382/239; 382/248; 382/276; 341/51; 341/87; 348/388.1; 348/403.1; 348/404.1; 375/240.01; 375/240.02; 375/240.03; 704/201; 704/500

(58) Field of Search ................................ 382/232, 233, 382/235, 239, 240, 248, 251, 234, 236, 242, 245, 246, 247, 276; 375/299, 240–240.03; 348/403.1, 404.1, 405.1, 384.1, 388.1, 395.1; 341/51, 87; 704/201, 500

(56) References Cited

U.S. PATENT DOCUMENTS 4,894,713 A * 1/1990 Delogne et al. ............ 348/403
5,028,995 A * 7/1991 Izawa et al. ................ 348/402
5,263,100 A * 11/1993 Kim et al. .................. 382/166
5,394,473 A * 2/1995 Davidson .................... 704/211
5,928,331 A * 7/1999 Bushmitch .................. 709/231

OTHER PUBLICATIONS

P.G. Sherwood et al., "Error Protection of Wavelet Coded Images Using Residual Source Redundancy," Proc. of the 31st Asilomar Conference on Signals, Systems and Computers, Nov. 1997.

(List continued on next page.)

*Primary Examiner*—Leo Boudreau
*Assistant Examiner*—Daniel G. Mariam
(74) *Attorney, Agent, or Firm*—Ryan, Mason & Lewis, LLP

(57) ABSTRACT

A multiple description (MD) joint source-channel (JSC) encoder in accordance with the invention encodes n components of a signal for transmission over in channels of a communication medium. In illustrative embodiments, the invention provides optimal or near-optimal transforms for applications in which at least one of n and m is greater than two, and applications in which the failure probabilities of the m channels are non-independent and non-equivalent. The signal to be encoded may be a data signal, a speech signal, an audio signal, an image signal, a video signal or other type of signal, and each of the m channels may correspond to a packet or a group of packets to be transmitted over the medium. A given n×m transform implemented by the MD JSC encoder may be in the form of a cascade structure of several transforms each having dimension less than n×m. The transform may also be configured to provide a substantially equivalent rate for each of the m channels.

24 Claims, 7 Drawing Sheets

OTHER PUBLICATIONS

M.T. Orchard et al., "Redundancy Rate–Distortion Analysis of Multiple Description Coding Using Pairwise Correlating Transforms," Proc. IEEE Int. Conf. Image Proc., Santa Barbara, CA, Oct. 1997.

L. Ozarow, "On a source–coding problem with two channels and three receivers," Bell Syst. Tech. J., 59(8):1417–1426, 1980.

A.A. El Gamal et al., "Achievable Rates for Multiple Descriptions," IEEE Trans. Inform. Th., 28(6):851–857, Nov. 1982.

V.A. Vaishampayan, "Design of Multiple Description Scalar Quantizers," IEEE Trans. Inform. Th., 39(3):821–834, May 1993.

P. Subrahmanya et al., "Multiple Descriptions Encoding of Images," Preprint, 1997.

Y. Wang et al., "Multiple Description Image Coding for Noisy Channels by Pairing Transform Coefficients," Proc. First IEEE SP Workshop on Multimedia Signal Processing, pp. 419–424, Princeton, NJ, Jun. 1997.

J.K. Wolf et al., "Source Coding for Multiple Descriptions," Bell Syst. Tech. J., 59(8):1417–1426, 1980.

J.–C. Batlo et al., "Asympatotic Performance of Multiple Description Transform Codes," IEEE Trans. Inform. Th., 43(2):703–707, 1997.

V.K. Goyal et al., "Quantized Overcomplete Expansions in $IR^N$: Analysis, S$^{ynthesis\ and}$ Algorithms," IEEE Trans. Inform. Th., 44(1):Jan. 16, 1998.

T. Berger et al., "Minimum Breakdown Degradation in Binary Source Encoding" IEEE Trans. Inform. Th., 29(6):807, Nov. 1983.

R.M. Gray et al., "Source Coding for a Simple Network," Bell Syst. Tech. J., 53(8):1681, Nov. 1974.

Z. Zhang et al., "New Results in Binary Multiple Descriptions," IEEE Trans. Inform. Th., 33(4):502, Jul. 1987.

R. Ahlswede, "The Rate–Distortion Region for Multiple Descriptions Without Excess Rate," IEEE Trans. Inform. Th., 1995.

W.H.R. Equitz et al., "Successive Refinement of Information," IEEE Trans. Inform. Th., 37(2):269, Mar. 1991.

H.S. Witsenhausen et al., "Source Coding for Multiple Descriptions II: A Binary Source," Bell Syst. Tech. J., 60(10):2281, Dec. 1981.

V.A. Vaishampayan et al., "Design of Entropy–Constrained Multiple–Description Scalar Quantizers," IEEE Trans. Inform. Th., 40(1), Jan. 1994.

V.A. Vaishampayan et al., "Asymptotic Analysis of Multiple Description Quantizers," IEEE Trans. Inform. Th., 1994.

S.–M. Yang et al., "Low–Delay Communications for Rayleigh Fading Channels: An Application of the Multiple Description Quantizer," IEEE Trans. Comm., 43(11), Nov. 1995.

A. Ingle et al., "DPCM System Design for Diversity Systems with Applications to Packetized Speech," IEEE Trans. Sp. and Audio Proc., 3(1):48, Jan. 1995.

V.A. Vaishampayan et al., "Speech Predictor Design for Diversity Communication Systems," IEEE Workshop on Speech Coding for Telecommunications, Annapolis, MD, Sep. 1995.

V.A. Vaishampayan, "Application of Multiple Description Codes to Image and Video Transmission over Lossy Networks," 7th Int'l Workshop on Packet Video, Mar. 18–19, 1996, Brisbane, Australia.

* cited by examiner

MULTIPLE DESCRIPTION TRANSFORM CODING USING OPTIMAL TRANSFORMS OF ARBITRARY DIMENSION

FIELD OF THE INVENTION

The present invention relates generally to multiple description transform coding (MDTC) of data, speech, audio, images, video and other types of signals for transmission over a network or other type of communication medium.

BACKGROUND OF THE INVENTION

Multiple description transform coding (MDTC) is a type of joint source-channel coding (JSC) designed for transmission channels which are subject to failure or "erasure." The objective of MDTC is to ensure that a decoder which receives an arbitrary subset of the channels can produce a useful reconstruction of the original signal. A distinguishing characteristic of MDTC is the introduction of correlation between transmitted coefficients in a known, controlled manner so that lost coefficients can be statistically estimated from received coefficients. This correlation is used at the decoder at the coefficient level, as opposed to the bit level, so it is fundamentally different than techniques that use information about the transmitted data to produce likelihood information for the channel decoder. The latter is a common element in other types of JSC coding systems, as shown, for example, in P. G. Sherwood and K. Zeger, "Error Protection of Wavelet Coded Images Using Residual Source Redundancy," Proc. of the $31^{st}$ Asilomar Conference on Signals, Systems and Computers, November 1997.

A known MDTC technique for coding pairs of independent Gaussian random variables is described in M. T. Orchard et al., "Redundancy Rate-Distortion Analysis of Multiple Description Coding Using Pairwise Correlating Transforms," Proc. IEEE Int. Conf. Image Proc., Santa Barbara, Calif., October 1997. This MDTC technique provides optimal 2×2 transforms for coding pairs of signals for transmission over two channels. However, this technique as well as other conventional techniques fail to provide optimal generalized n×m transforms for coding any n signal components for transmission over any m channels. Moreover, the optimality of the 2×2 transforms in the M.T. Orchard et al. reference requires that the channel failures be independent and have equal probabilities. The conventional techniques thus generally do not provide optimal transforms for applications in which, for example, channel failures either are dependent or have unequal probabilities, or both. This inability of conventional techniques to provide suitable transforms for arbitrary dimensions and different types of channel failure probabilities unduly restricts the flexibility of MDTC, thereby preventing its effective implementation in many important applications.

SUMMARY OF THE INVENTION

The invention provides MDTC techniques which can be used to implement optimal or near-optimal n×m transforms for coding any number n of signal components for transmission over any number m of channels. A multiple description (MD) joint source-channel (JSC) encoder in accordance with an illustrative embodiment of the invention encodes n components of a signal for transmission over in channels of a communication medium, in applications in which at least one of n and m may be greater than two, and in which the failure probabilities of the m channels may be non-independent and non-equivalent. An n×m transform implemented by the MD JSC encoder may be in the form of a cascade structure of several transforms each having dimension less than n×m. An exemplary transform in accordance with the invention may include an additional degree of freedom not found in conventional MDTC transforms. This additional degree of freedom provides considerable improvement in design flexibility, and may be used, for example, to partition a total available rate among the m channels such that each channel has substantially the same rate.

In accordance with another aspect of the invention, an MD JSC encoder may include a series combination of N "macro" MD encoders followed by an entropy coder, and each of the N macro MD encoders includes a parallel arrangement of M "micro" MD encoders. Each of the M micro MD encoders implements one of: (i) a quantizer block followed by a transform block, (ii) a transform block followed by a quantizer block, (iii) a quantizer block with no transform block, and (iv) an identity function. This general MD JSC encoder structure allows the encoder to implement any desired n×m transform while also minimizing design complexity.

The MDTC techniques of the invention do not require independent or equivalent channel failure probabilities. As a result, the invention allows MDTC to be implemented effectively in a much wider range of applications than has heretofore been possible using conventional techniques. The MDTC techniques of the invention are suitable for use in conjunction with signal transmission over many different types of channels, including lossy packet networks such as the Internet as well as broadband ATM networks, and may be used with data, speech, audio, images, video and other types of signals.

DETAILED DESCRIPTION OF THE INVENTION

The invention will be illustrated below in conjunction with exemplary MDTC systems. The techniques described may be applied to transmission of a wide variety of different types of signals, including data signals, speech signals, audio signals, image signals, and video signals, in either compressed or uncompressed formats. The term "channel" as used herein refers generally to any type of communication medium for conveying a portion of a encoded signal, and is intended to include a packet or a group of packets. The term "packet" is intended to include any portion of an encoded signal suitable for transmission as a unit over a network or other type of communication medium.

Figure 1:
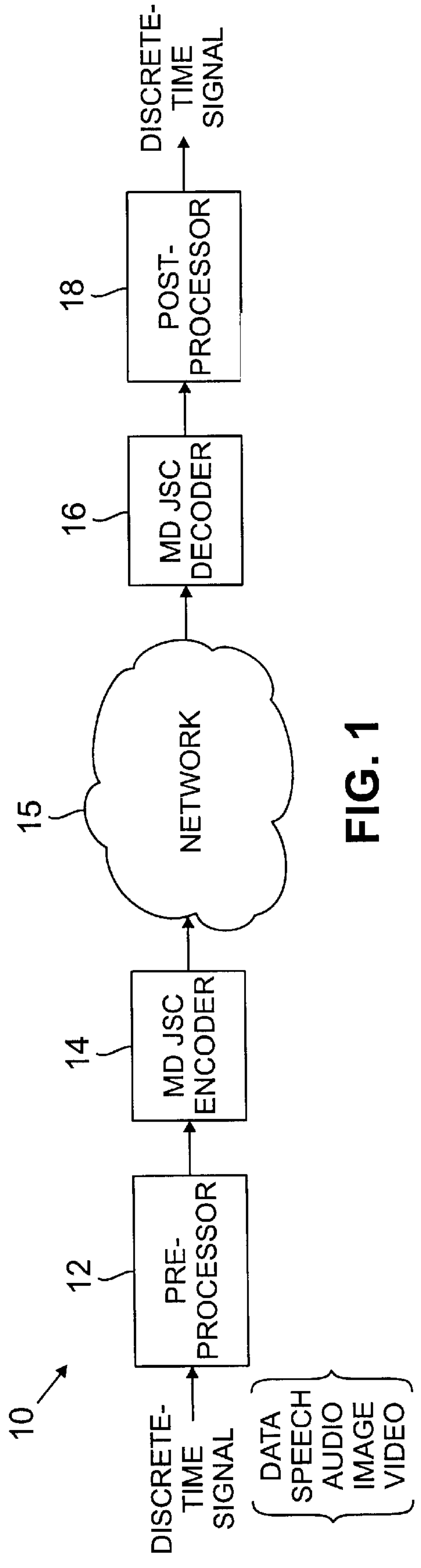
FIG. 1 shows an exemplary communication system in accordance with the invention.

FIG. 1 shows a communication system 10 configured in accordance with an illustrative embodiment of the invention. A discrete-time signal is applied to a pre-processor 12. The discrete-time signal may represent, for example, a data signal, a speech signal, an audio signal, an image signal or a video signal, as well as various combinations of these and other types of signals. The operations performed by the pre-processor 12 will generally vary depending upon the application. The output of the preprocessor is a source sequence $\{x_k\}$ which is applied to a multiple description (MD) joint source-channel (JSC) encoder 14. The encoder 14 encodes n different components of the source sequence $\{x_k\}$ for transmission over m channels, using transform, quantization and entropy coding operations. Each of the m channels may represent, for example, a packet or a group of packets. The m channels are passed through a network 15 or other suitable communication medium to an MD JSC decoder 16. The decoder 16 reconstructs the original source sequence $\{x_k\}$ from the received channels. The MD coding implemented in encoder 14 operates to ensure optimal reconstruction of the source sequence in the event that one or more of the m channels are lost in transmission through the network 15. The output of the MD JSC decoder 16 is further processed in a post processor 18 in order to generate a reconstructed version of the original discrete-time signal.

Figure 2:
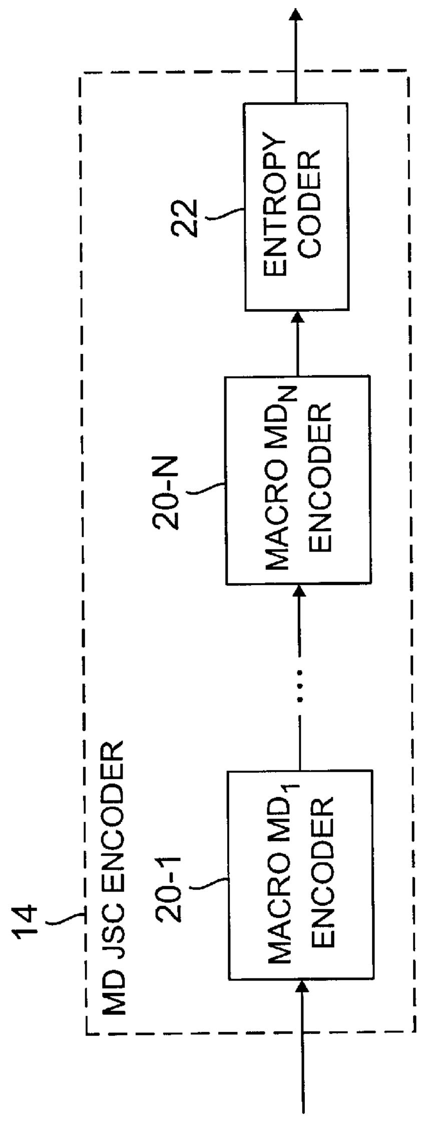
FIG. 2 shows a multiple description (MD) joint source-channel (JSC) encoder in accordance with the invention.
Figure 3:
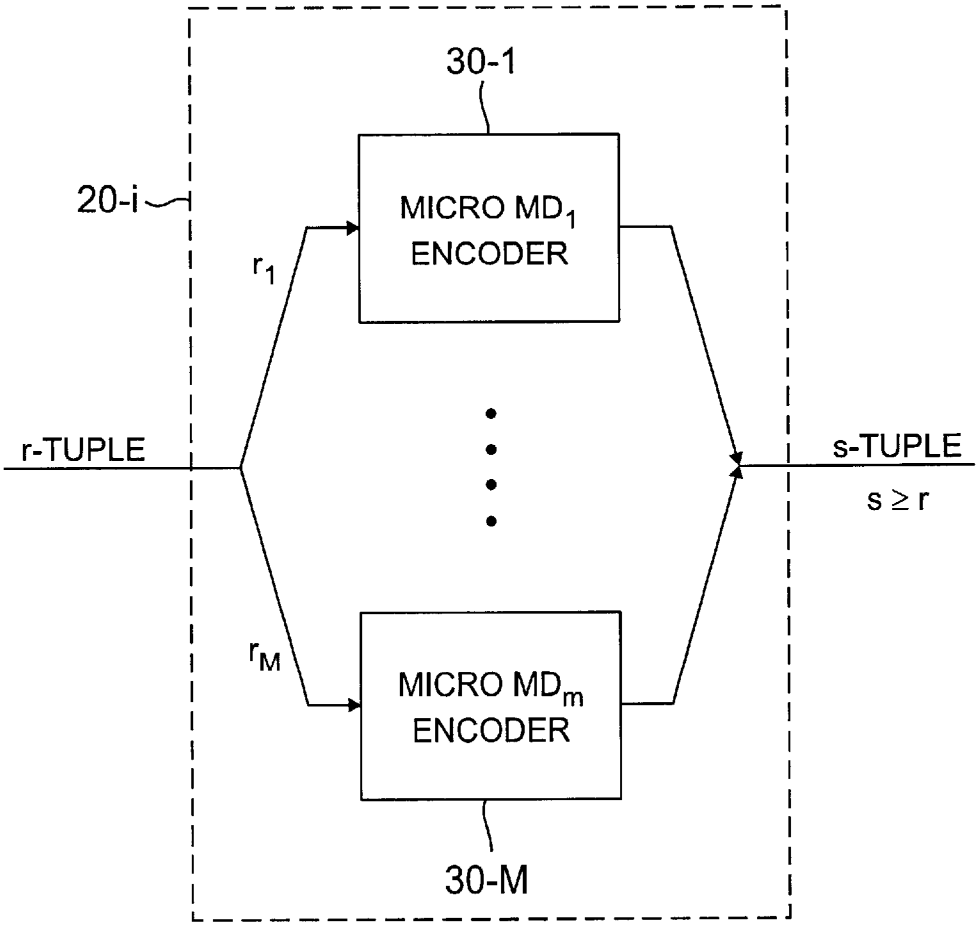
FIG. 3 shows an exemplary macro MD encoder for use in the MD JSC encoder of FIG. 2.

FIG. 2 illustrates the MD JSC encoder 14 in greater detail. The encoder 14 includes a series arrangement of N macro $MD_i$ encoders $MD_1, \ldots MD_N$ corresponding to reference designators 20-1, . . . 20-N. An output of the final macro $MD_i$ encoder 20-N is applied to an entropy coder 22. FIG. 3 shows the structure of each of the macro $MD_i$ encoders 20-i. Each of the macro $MD_i$ encoders 20-i receives as an input an r-tuple, where r is an integer. Each of the elements of the r-tuple is applied to one of M micro $MD_j$ encoders $MD_1, \ldots MD_N$ corresponding to reference designators 30-1, . . . 30-M. The output of each of the macro $MD_i$ encoders 20-i is an s-tuple, where s is an integer greater than or equal to r.

Figure 4:
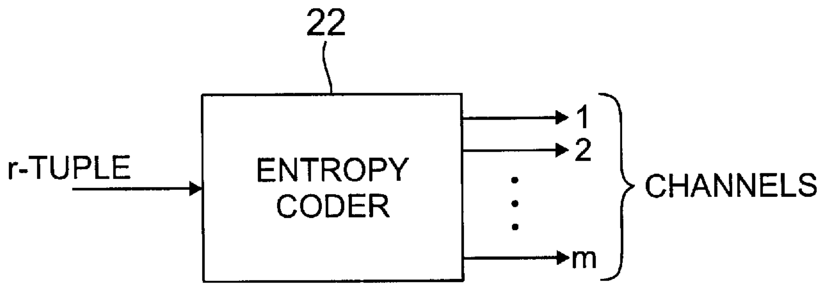
FIG. 4 shows an entropy encoder for use in the MD JSC encoder of FIG. 2.

FIG. 4 indicates that the entropy coder 22 of FIG. 2 receives an r-tuple as an input, and generates as outputs the m channels for transmission over the network 15. In accordance with the invention, the in channels may have any distribution of dependent or independent failure probabilities. More specifically, given that a channel i is in a state $S_i \in \{0, 1\}$, where $S_i=0$ indicates that the channel has failed while $S_i=1$ indicates that the channel is working, the overall state S of the system is given by the Cartesian product of the channel states $S_i$ over m, and the individual channel probabilities may be configured so as to provide any probability distribution function which can be defined on the overall state S.

Figure 5A:
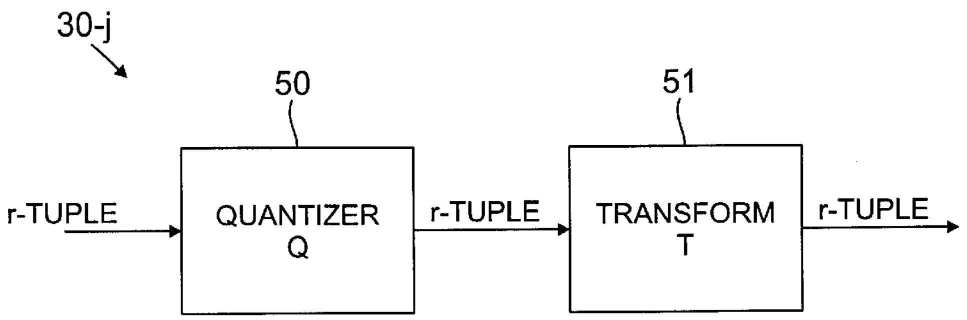
FIGS. 5A through 5D show exemplary micro MD encoders for use in the macro MD encoder of FIG. 3.
Figure 5B:
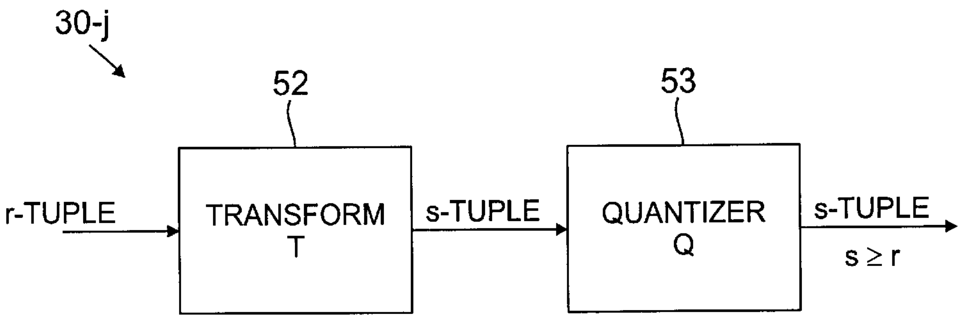
Figure 5C:
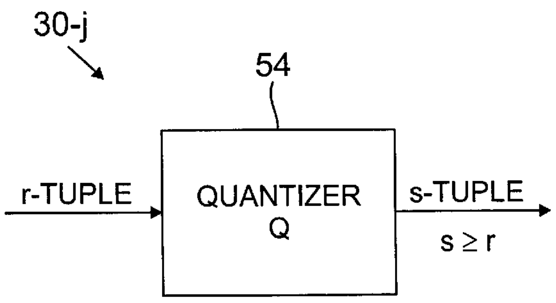
Figure 5D:
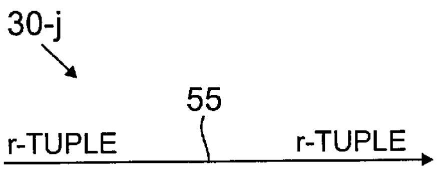

FIGS. 5A through 5D illustrate a number of possible embodiments for each of the micro $MD_j$ encoders 30-j. FIG. 5A shows an embodiment in which a micro $MD_j$ encoder 30-j includes a quantizer (Q) block 50 followed by a transform (Y) block 51. The Q block 50 receives an r-tuple as input and generates a corresponding quantized r-tuple as an output. The T block 51 receives the r-tuple from the Q block 50, and generates a transformed r-tuple as an output. FIG. 5B shows an embodiment in which a micro MD, encoder 30-j includes a T block 52 followed by a Q block 53. The T block 52 receives an r-tuple as input and generates a corresponding transformed s-tuple as an output. The Q block 53 receives the s-tuple from the T block 52, and generates a quantized s-tuple as an output, where s is greater than or equal to r. FIG. 5C shows an embodiment in which a micro $MD_j$ encoder 30-j includes only a Q block 54. The Q block 54 receives an r-tuple as input and generates a quantized s-tuple as an output, where s is greater than or equal to r. FIG. 5D shows another possible embodiment, in which a micro $MD_j$ encoder 30-j does not include a Q block or a T block but instead implements an identity function, simply passing an r-tuple at its input though to its output. The micro $MD_j$ encoders 30-j of FIG. 3 may each include a different one of the structures shown in FIGS. 5A through 5D.

Figure 6A:
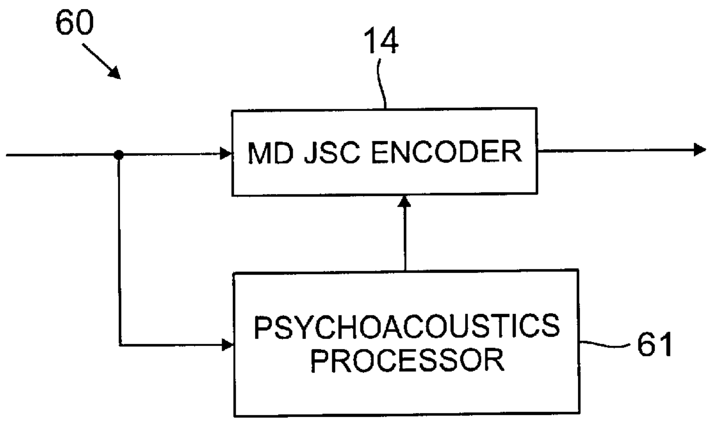
FIGS. 6A, 6B and 6C show respective audio encoder, image encoder and video encoder embodiments of the invention, each including the MD JSC encoder of FIG. 2.
Figure 6B:
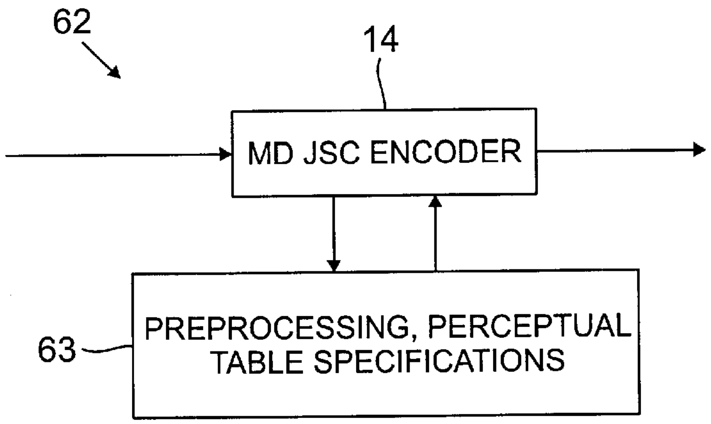
Figure 6C:
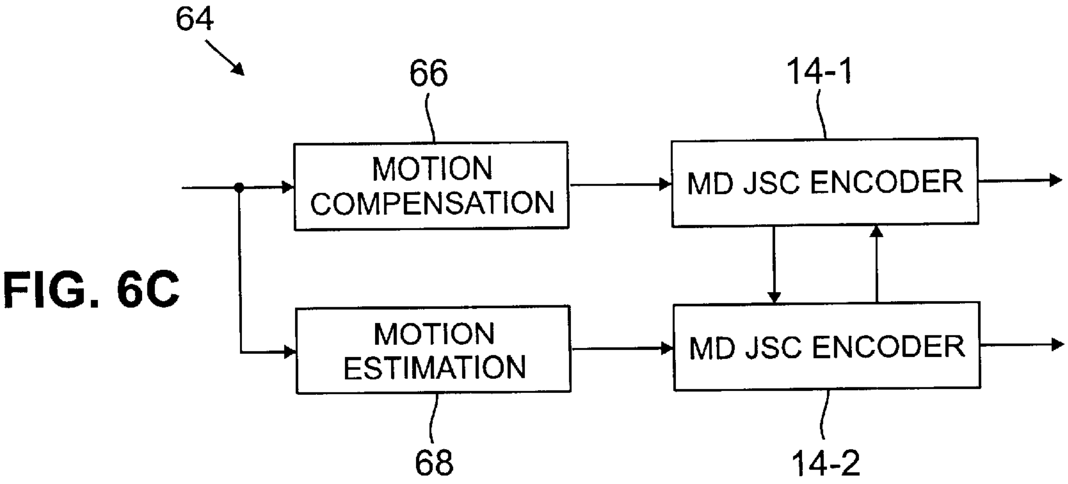

FIGS. 6A through 6C illustrate the manner in which the MD JSC encoder 14 of FIG. 2 can be implemented in a variety of different encoding applications. In each of the embodiments shown in FIGS. 6A through 6C, the MD JSC encoder 14 is used to implement the quantization, transform and entropy coding operations typically associated with the corresponding encoding application. FIG. 6A shows an audio coder 60 which includes an MD JSC encoder 14 configured to receive input from a conventional psychoacoustics processor 61. FIG. 6B shows an image coder 62 which includes an MD JSC encoder 14 configured to interact with an element 63 providing preprocessing functions and perceptual table specifications. FIG. 6C shows a video coder 64 which includes first and second MD JSC encoders 14-1 and 14-2. The first encoder 14-1 receives input from a conventional motion compensation element 66, while the second encoder 14-2 receives input from a conventional motion estimation element 68. The encoders 14-1 and 14-2 are interconnected as shown. It should be noted that these are only examples of applications of an MD JSC encoder in accordance with the invention. It will be apparent to those skilled in the art that numerous alternate configurations may also be used, in audio, image, video and other applications.

A general model for analyzing MDTC techniques in accordance with the invention will now be described. Assume that a source sequence $\{x_k\}$ is input to an MD JSC encoder, which outputs m streams at rates $R_1, R_2, \ldots R_m$. These streams are transmitted on Mil separate channels. One version of the model may be viewed as including many receivers, each of which receives a subset of the channels and uses a decoding algorithm based on which channels it receives. More specifically, there may be $2^m-1$ receivers, one for each distinct subset of streams except for the empty set, and each experiences some distortion. An equivalent version of this model includes a single receiver when each channel may have failed or not failed, and the status of the channel is known to the receiver decoder but not to the encoder. Both versions of the model provide reasonable approximations of behavior in a lossy packet network. As previously noted, each channel may correspond to a packet or a set of packets. Some packets may be lost in transmission, but because of header information it is known which packets are lost. An appropriate objective in a system which can be characterized in this manner is to minimize a weighted sum of the distortions subject to a constraint on a total rate R. For m=2, this minimization problem is related to a problem from information theory called the multiple description problem. $D_0$, $D_1$ and $D_2$ denote the distortions when both channels are received, only channel 1 is received, and only channel 2 is received, respectively. The multiple description problem involves determining the achievable $(R_1, R_2, D_0, D_1, D_2)$-tuples. A complete characterization for an independent, identically-distributed (i.i.d.) Gaussian source and squared-error distortion is described in L. Ozarow, "On a source-coding problem with two channels and three receivers," Bell Syst. Tech. J., 59(8):1417–1426, 1980. It should be noted that the solution described in the L. Ozarow reference is non-constructive, as are other achievability results from the information theory literature.

An MDTC coding structure for implementation in the MD JSC encoder 14 of FIG. 2 in accordance with the invention will now be described. In this illustrative embodiment, it will be assumed for simplicity that the source sequence $\{x_k\}$ input to the encoder is an i.i.d. sequence of zero-mean jointly Gaussian vectors with a known correlation matrix $R_x=[x_k x_k^T]$. The vectors can be obtained by blocking a scalar Gaussian source. The distortion will be measured in terms of mean-squared error (MSE). Since the source in this example is jointly Gaussian, it can also be assumed without loss of generality that the components are independent. If the components are not independent, one can use a Karhunen-Loeve transform of the source at the encoder and the inverse at each decoder. This embodiment of the invention utilizes the following steps for implementing MDTC of a given source vector x:

1. The source vector x is quantized using a uniform scalar quantizer with stepsize $\Delta: x_{qi}=[x_i]_\Delta$, where $[\cdot]_\Delta$ denotes rounding to the nearest multiple of $\Delta$.
2. The vector $x_q=[x_{q1}, x_{q2}, \ldots x_{qn}]^T$ is transformed with an invertible, discrete transform $\hat{T}: \Delta Z^n \to \Delta Z^n$, $y=\hat{T}(x_q)$. The design and implementation of $\hat{T}$ are described in greater detail below.
3. The components of y are independently entropy coded.
4. If m>n, the components of y are grouped to be sent over the m channels.

When all of the components of y are received, the reconstruction process is to exactly invert the transform $\hat{T}$ to get $\hat{x}=x_q$. The distortion is the quantization error from Step 1 above. If some components of y are lost, these components are estimated from the received components using the statistical correlation introduced by the transform $\hat{T}$. The estimate $\hat{x}$ is then generated by inverting the transform as before.

Starting with a linear transform T with a determinant of one, the first step in deriving a discrete version $\hat{T}$ is to factor T into "lifting" steps. This means that T is factored into a product of lower and upper triangular matrices with unit diagonals $T=T_1T_2 \ldots T_k$. The discrete version of the transform is then given by:

$$\hat{T}(x_q)=[T_1[T_2 \ldots [T_k x_q]_\Delta]_\Delta]_\Delta. \quad (1)$$

The lifting structure ensures that the inverse of $\hat{T}$ can be implemented by reversing the calculations in (1):

$$\hat{T}^{-1}(y)=[T_k^{-1} \ldots [T_2^{-1}[T_1^{-1}y]_\Delta]_\Delta]_\Delta.$$

The factorization of T is not unique. Different factorizations yield different discrete transforms, except in the limit as A approaches zero. The above-described coding structure is a generalization of a 2×2 structure described in the above-cited M.T. Orchard et al. reference. As previously noted, this reference considered only a subset of the possible 2×2 transforms; namely, those implementable in two lifting steps.

It is important to note that the illustrative embodiment of the invention described above first quantizes and then applies a discrete transform. If one were to instead apply a continuous transform first and then quantize, the use of a nonorthogonal transform could lead to non-cubic partition cells, which are inherently suboptimal among the class of partition cells obtainable with scalar quantization. See, for example, A. Gersho and R. M. Gray, "Vector Quantization and Signal Compression," Kluwer Acad. Pub., Boston, Mass. 1992. The above embodiment permits the use of discrete transforms derived from nonorthogonal linear transforms, resulting in improved performance.

An analysis of an exemplary MDTC system in accordance with the invention will now be described. This analysis is based on a number of fine quantization approximations which are generally valid for small $\Delta$. First, it is assumed that the scalar entropy of $y=\hat{T}([x]_\Delta)$ is the same as that of $[Tx]_\Delta$. Second, it is assumed that the correlation structure of y is unaffected by the quantization. Finally, when at least one component of y is lost, it is assumed that the distortion is dominated by the effect of the erasure, such that quantization can be ignored. The variances of the components of x are denoted by $\sigma_1^2, \sigma_2^2 \ldots \sigma_n^2$ and the correlation matrix of x is denoted by $R_x$, where $R_x=\text{diag}(\sigma_1^2, \sigma_2^2 \ldots \sigma_n^2$. Let $R_y=TR_xT^T$. In the absence of quantization, $R_y$ would correspond to the correlation matrix of y. Under the above-noted fine quantization approximations, $R_y$ will be used in the estimation of rates and distortions.

The rate can be estimated as follows. Since the quantization is fine, y is approximately the same as $[(Tx)_i]_\Delta$, i.e., a uniformly quantized Gaussian random variable. If $y_i$ is treated as a Gaussian random variable with power $\sigma_{yi}^2=(R_y)_{ii}$ quantized with stepsize $\Delta$, the entropy of the quantized coefficient is given by:

$$H(y_i)\approx \tfrac{1}{2}\log 2\pi e\sigma_{yi}^2-\log\Delta=\tfrac{1}{2}\log\sigma_{yi}^2+\tfrac{1}{2}\log 2\pi e-\log\Delta=\tfrac{1}{2}\log\sigma_{yi}^2+k_\Delta,$$

where $k_\Delta \triangleq (\log 2\pi e)/2-\log\Delta$ and all logarithms are base two. Notice that $k_\Delta$ depends only on $\Delta$. The total rate R can therefore be estimated as:

$$R=\sum_{i=1}^{n} H(y_i)=nk_\Delta+\frac{1}{2}\log\prod_{i=1}^{n}\sigma_{yi}^2. \quad (2)$$

The minimum rate occurs when the product from i=1 to n of $\sigma_{yi}^2$ is equivalent to the product from i=1 to n of $\sigma_i^2$, and at this rate the components of y are uncorrelated. It should be noted that T=I is not the only transform which achieves the minimum rate. In fact, it will be shown below that an arbitrary split of the total rate among the different components of y is possible. This provides a justification for using a total rate constraint in subsequent analysis.

The distortion will now be estimated, considering first the average distortion due only to quantization. Since the quantization noise is approximately uniform, the distortion is $\Delta^2/12$ for each component. Thus the distortion when no components are lost is given by:

$$D_0=\frac{n\Delta^2}{12} \quad (3)$$

and is independent of T.

The case when l>0 components are lost will now be considered. It first must be determined how the reconstruction will proceed. By renumbering the components if necessary, assume that $y_1, y_2, \ldots y_{n-l}$ are received and $y_{n-l+1}, \ldots y_n$ are lost. First partition y into "received" and "not received" portions as $y=[y_r, y_{nr}]$ where $y_r=[y_1, Y_2, \ldots y_{n-l}]^T$ and $y_{nr}=[y_{n-l+1}, \ldots y_n]^T$. The minimum MSE estimate $\hat{x}$ of x given $y_r$ is $E[x|y_r]$, which has a simple closed form because in this example x is a jointly Gaussian vector. Using the linearity of the expectation operator gives the following sequence of calculations:

$$\hat{x} = E[x \mid y_r] = E[T^{-1}Tx \mid y_r] = T^{-1}E[Tx \mid y_r] \quad (4)$$

$$= T^{-1}E\left[\begin{bmatrix} y_r \\ y_{nr} \end{bmatrix} \middle| y_r\right] = T^{-1}\begin{bmatrix} y_r \\ E[y_{nr} \mid y_r] \end{bmatrix}.$$

If the correlation matrix of y is partitioned in a way compatible with the partition of y as:

$$R_y = TR_xT^T = \begin{bmatrix} R_1 & B \\ B^T & R_2 \end{bmatrix},$$

then it can be shown that the conditional signal $y_r|y_{nr}$ is Gaussian with mean $B^TR_1^{-1}y_r$ and correlation matrix $\underline{\underline{A}}\,\Delta R_2-B^TR_1^{-1}B$. Thus, $E[y_r|y_{nr}]=B^TR_1^{-1}y_r$, and $\eta\ \underline{\underline{\Delta}}\, y_{nr}-E[y_{nr}|y_r]$ is Gaussian with zero mean and correlation matrix A. The variable $\eta$ denotes the error in predicting $y_{nr}$ from $y_r$ and hence is the error caused by the erasure. However, because a nonorthogonal transform has been used in this example, $T^1$ is used to return to the original coordinates before computing the distortion. Substituting $y_{nr}-\eta$ in (4) above gives the following expression for $\hat{x}$:

$$T^{-1}\begin{bmatrix} y_r \\ y_{nr}-\eta \end{bmatrix} = x + T^{-1}\begin{bmatrix} 0 \\ -\eta \end{bmatrix},$$

such that $\|x-\hat{x}\|$ is given by:

$$\left\| T^{-1}\begin{bmatrix} 0 \\ \eta \end{bmatrix} \right\|^2 = \eta^T U^T U \eta,$$

where U is the last l columns of $T^{-1}$. The expected value $E[\|x-\hat{x}\|]$ is then given by:

$$\sum_{i=1}^{l}\sum_{j=1}^{l}(U^TU)_{ij}A_{ij}. \quad (5)$$

The distortion with l erasures is denoted by $D_1$. To determine $D_1$, (5) above is averaged over all possible combinations of erasures of l out of n components, weighted by their probabilities if the probabilities are non-equivalent. An additional distortion criteria is a weighted sum $\overline{D}$ of the distortions incurred with different numbers of channels available, where $\overline{D}$ is given by:

$$\sum_{l=1}^{n}\alpha_l D_l.$$

For a case in which each channel has a failure probability of p and the channel failures are independent, the weighting $$\alpha_l = \binom{n}{l}p^l(1-p)^{n-l}$$

makes the weighted sum $\overline{D}$ the overall expected MSE. Other choices of weighting could be used in alternative embodiments. Consider an image coding example in which an image is split over ten packets. One might want acceptable image quality as long as eight or more packets are received. In this case, one could set $\alpha_3=\alpha_4= \ldots =\alpha_{10}=0$.

The above expressions may be used to determine optimal transforms which minimize the weighted sum $\overline{D}$ for a given rate R. Analytical solutions to this minimization problem are possible in many applications. For example, an analytical solution is possible for the general case in which n=2 components are sent over m=2 channels, where the channel failures have unequal probabilities and may be dependent. Assume that the channel failure probabilities in this general case are as given in the following table.

| | | Channel 1 | |
|---|---|---|---|
| | | no failure | failure |
| Channel 2 | failure | $1 - p_0 - p_1 - p_2$ | $p_1$ |
| | no failure | $p_2$ | $p_0$ |

If the transform T is given by:

$$T = \begin{bmatrix} a & b \\ c & d \end{bmatrix},$$

minimizing (2) over transforms with a determinant of one gives a minimum possible rate of:

$$R^*=2k_\Delta+\log \sigma_1\sigma_2.$$

The difference $\rho=R-R^*$ is referred to as the redundancy, i.e., the price that is paid to reduce the distortion in the presence of erasures. Applying the above expressions for rate and distortion to this example, and assuming that $\sigma_1>\sigma_2$, it can be shown that the optimal transform will satisfy the following expression:

$$|a| = \frac{\sigma_2}{2c\sigma_1}\left[\sqrt{2^{2\rho}-1} + \sqrt{2^{2\rho}-1-4bc(bc+1)}\right].$$

The optimal value of bc is then given by:

$$(bc)_{optimal} = -\frac{1}{2} + \frac{1}{2}\left(\frac{p_1}{p_2}-1\right)\left[\left(\frac{p_1}{p_2}+1\right)^2 - 4\left(\frac{p_1}{p_2}\right)2^{-2\rho}\right]^{-1/2}.$$

The value of $(bc)_{optimal}$ ranges from −1 to 0 as $p_1/p_2$ ranges from 0 to ∞. The limiting behavior can be explained as follows: Suppose $p_1>>p_2$, i.e., channel 1 is much more reliable than channel 2. Since $(bc)_{optimal}$ approaches 0, ad must approach 1, and hence one optimally sends $x_1$ (the larger variance component) over channel 1 (the more reliable channel) and vice-versa.

If $p_1=p_2$ in the above example, then $(bc)_{optimal}=-½$, independent of $\rho$. The optimal set of transforms is then given by: $a\neq 0$ (but otherwise arbitrary), $c=-½b$, $d=½a$ and $$b=\pm(2^\rho-\sqrt{2^{2\rho}-1})\sigma_1 a/\sigma_2.$$

Using a transform from this set gives:

$$D_1 = \frac{1}{2}(D_{1,1} + D_{1,2}) = \sigma_1^2 - \frac{1}{2\cdot 2^{\rho}\left(2^{\rho} - \sqrt{2^{2\rho} - 1}\right)}(\sigma_1^2 - \sigma_2^2). \qquad (6)$$

Figure 7A:
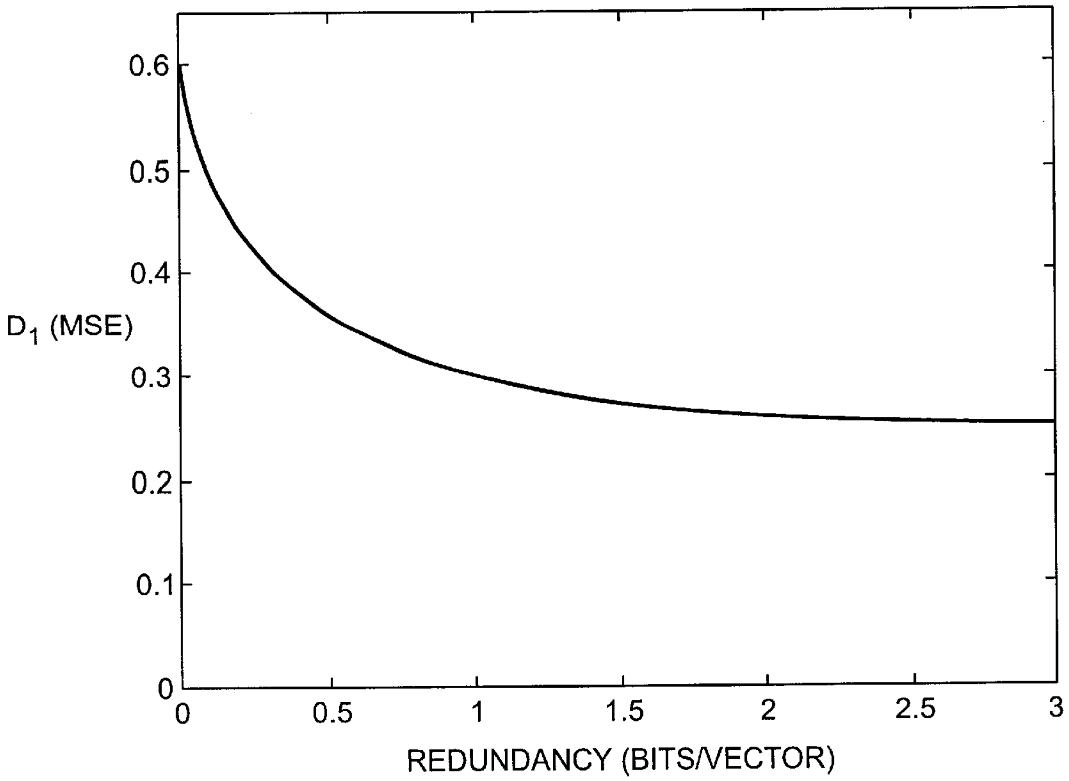
FIG. 7A shows a relationship between redundancy and channel distortion in an exemplary embodiment of the invention.
Figure 7B:
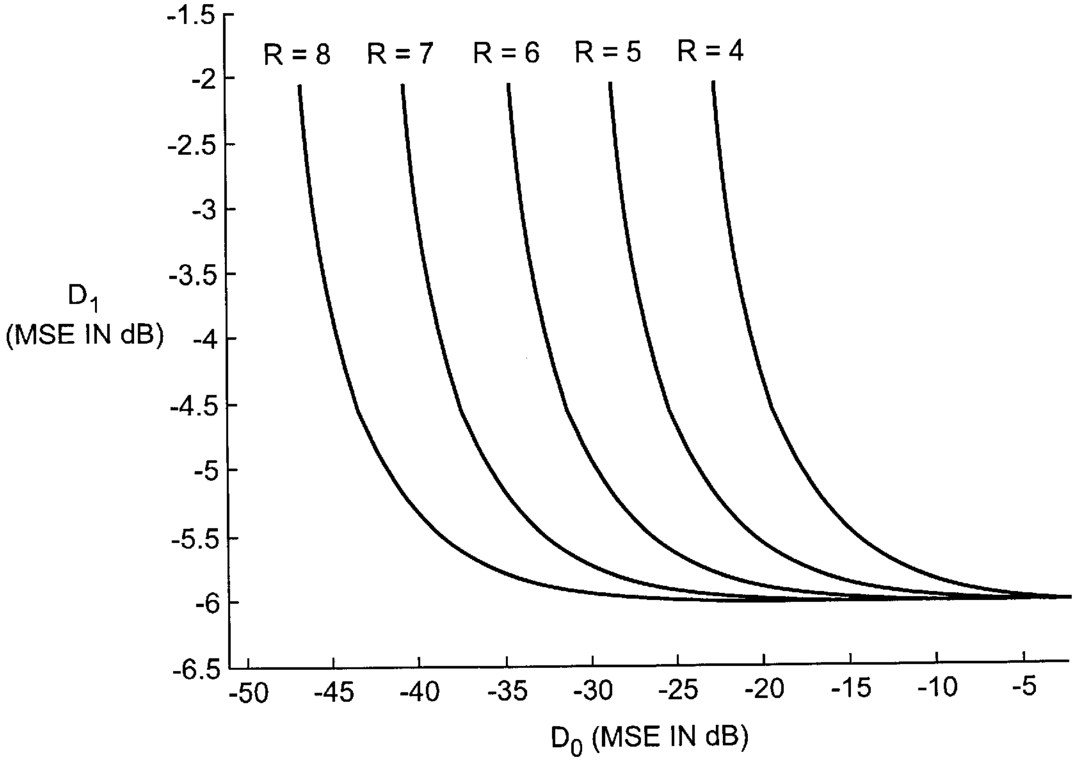
FIG. 7B shows relationships between distortion when both of two channels are received and distortion when one of the two channels is lost, for various rates, in an exemplary embodiment of the invention.

This relationship is plotted in FIG. 7A for values of $\sigma_1=1$ and $\sigma_2=0.5$. As expected, $D_1$ starts at a maximum value of $(\sigma_1^2+\sigma_2^2)/2$ and asymptotically approaches a minimum value of $\sigma_2^2$. By combining (2), (3) and (6), one can find the relationship between R, $D_0$ and $D_1$. FIG. 7B shows a number of plots illustrating the trade-off between $D_0$ and $_{1,}$ for various values of R. It should be noted that the optimal set of transforms given above for this example provides an "extra" degree of freedom, after fixing p, that does not affect the ρ vs. $D_1$ performance. This extra degree of freedom can be used, for example, to control the partitioning of the total rate between the channels, or to simplify the implementation.

Although the conventional 2×2 transforms described in the above-cited M.T. Orchard et al. reference can be shown to fall within the optimal set of transforms described herein when channel failures are independent and equally likely, the conventional transforms fail to provide the above-noted extra degree of freedom, and are therefore unduly limited in terms of design flexibility.

Moreover, the conventional transforms in the M.T. Orchard et al. reference do not provide channels with equal rate (or, equivalently, equal power). The extra degree of freedom in the above example can be used to ensure that the channels have equal rate, i.e., that $R_1=R_2$, by implementing the transform such that $|a|=|c|$ and $|b|=|d|$. This type of rate equalization would generally not be possible using conventional techniques without rendering the resulting transform suboptimal.

As previously noted, the invention may be applied to any number of components arid any number of channels. For example, the above-described analysis of rate and distortion may be applied to transmission of n=3 components over m=3 channels. Although it becomes more complicated to obtain a closed form solution, valious simplifications can be made in order to obtain a near-optimal solution. If it is assumed in this example that $\sigma_1>\sigma_2>\sigma_3$, and that the channel failure probabilities are equal and small, a set of transforms that gives near-optimal performance is given by:

$$\begin{bmatrix} a & -\frac{\sqrt{3}\,\sigma_1 a}{\sigma_2} & -\frac{\sigma_2}{6\sqrt{3}\,\sigma_1^2 a^2} \\ 2a & 0 & \frac{\sigma_2}{6\sqrt{3}\,\sigma_1^2 a^2} \\ a & \frac{\sqrt{3}\,\sigma_1 a}{\sigma_2} & -\frac{\sigma_2}{6\sqrt{3}\,\sigma_1^2 a^2} \end{bmatrix}.$$

Optimal or near-optimal transforms can be generated in a similar manner for any desired number of components and number of channels.

Figure 8:
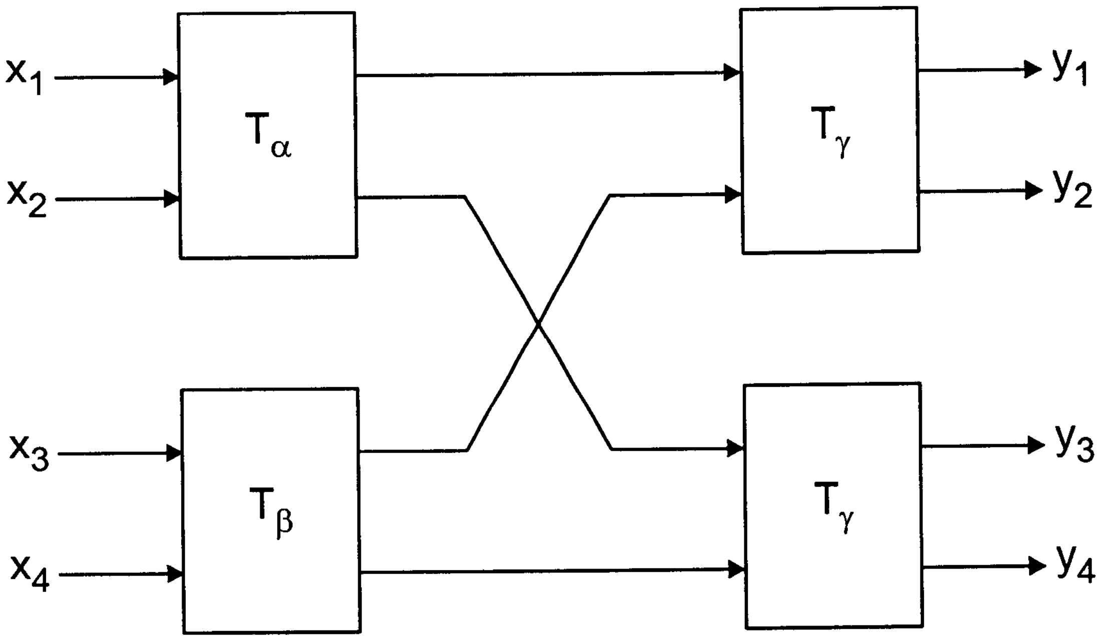
FIG. 8 illustrates an exemplary 4×4 cascade structure which may be used in an MD JSC encoder in accordance with the invention.

FIG. 8 illustrates one possible way in which the MDTC techniques described above can be extended to an arbitrary number of channels, while maintaining reasonable ease of transform design. This 4×4 transform embodiment utilizes a cascade structure of 2×2 transforms, which simplifies the transform design, as well as the encoding and decoding processes (both with and without erasures), when compared to use of a general 4×4 transform. In this embodiment, a 2×2 transform $T_\alpha$ is applied to components $x_1$ and $x_2$, and a 2×2 transform $T_\beta$ is applied to components $x_3$ and $x_4$. The outputs of the transforms $T_\alpha$ and $T_\beta$ are routed to inputs of two 2×2 transforms $T_\gamma$ as shown. The outputs of the two 2×2 transforms $T_\gamma$ correspond to the four channels $y_1$ through $y_4$. This type of cascade structure can provide substantial performance improvements as compared to the simple pairing of coefficients in conventional techniques, which generally cannot be expected to be near optimal for values of m larger than two. Moreover, the failure probabilities of the channels $y_1$ through $y_4$ need not have any particular distribution or relationship. FIGS. 2, 3, 4 and 5A–5D above illustrate more general extensions of the MDTC techniques of the invention to any number of signal components and channels.

The above-described embodiments of the invention are intended to be illustrative only. It should be noted that a complementary decoder structure corresponding to the encoder structure of FIGS. 2, 3, 4 and 5A–5D may be implemented in the MD JSC decoder 16 of FIG. 1. Alternative embodiments of the invention may utilize other coding structures and arrangements. Moreover, the invention may be used for a wide variety of different types of compressed and uncompressed signals, and in numerous coding applications other than those described herein. These and numerous other alternative embodiments within the scope of the following claims will be apparent to those skilled in the art.

What is claimed is:

1. A method of encoding a signal for transmission, comprising the steps of:

encoding n components of the signal in a multiple description encoder, wherein the encoding step utilizes a non-identity multiple description transform to produce at least n multiple description components each of which corresponds to a different output of the multiple description transform, and the resulting multiple description components are grouped into m groups of multiple description components for encoding and transmission over in channels, wherein at least one of n and m is greater than two; and transmitting the encoded components of the signal.

2. The method of claim 1 wherein the signal includes at least one of a data signal, a speech signal, an audio signal, an image signal and a video signal.

3. The method of claim 1 wherein each of the channels corresponds to at least one packet.

4. The method of claim 1 wherein at least a subset of the m channels have probabilities of failure which are not independent of one another.

5. The method of claim 1 wherein at least a subset of the m channels have non-equivalent probabilities of failure.

6. The method of claim 1 wherein the encoding step includes encoding the n components for transmission over the m channels using a transform of dimension n×m.

7. The method of claim 1 wherein the encoding step includes encoding the n components for transmission over the m channels using a transform which is in the form of a cascade structure of a plurality of transforms each having dimension less than n×m.

8. The method of claim 1 wherein the encoding step includes encoding the n components for transmission over the m channels using a transform which is configured to provide a substantially equivalent rate for each of the channels.

9. The method of claim 1 wherein the encoding step includes encoding the n components for transmission over the m channels in a multiple description joint source-channel encoder which includes a series combination of N multiple description encoders followed by an entropy coder, wherein each of the N multiple description encoders includes a parallel arrangement of M multiple description encoders.

10. The method of claim 9 wherein each of the M multiple description encoders implements one of: (i) a quantizer block followed by a transform block, (ii) a transform block followed by a quantizer block, (iii) a quantizer block with no transform block, and (iv) an identity function.

11. An apparatus for encoding a signal for transmission, comprising:

a processor for processing the signal to form components thereof; and a multiple description encoder for encoding n components of the signal, wherein the encoding process utilizes a non-identity multiple description transform to produce at least n multiple description components each of which corresponds to a different output of the multiple description transform, and the resulting multiple description components are grouped into m groups of multiple description components for encoding and transmission over m channels, wherein at least one of n and m is greater than two.

12. The apparatus of claim 11 wherein the signal includes at least one of a data signal, a speech signal, an audio signal, an image signal and a video signal.

13. The apparatus of claim 11 wherein each of the channels corresponds to at least one packet.

14. The apparatus of claim 11 wherein at least a subset of the m channels have probabilities of failure which are not independent of one another.

15. The apparatus of claim 11 wherein at least a subset of the m channels have non-equivalent probabilities of failure.

16. The apparatus of claim 11 wherein the multiple description joint source-channel encoder is operative to encode the n components for transmission over the m channels using a transform of dimension n×m.

17. The apparatus of claim 11 wherein the multiple description joint source-channel encoder is operative to encode the n components for transmission over the m channels using a transform which is in the form of a cascade structure of a plurality of transforms each having dimension less than n×m.

18. The apparatus of claim 11 wherein the multiple description joint source-channel encoder is operative to encode the n components for transmission over the m channels using a transform which is configured to provide a substantially equivalent rate for each of the channels.

19. The apparatus of claim 11 wherein the multiple description joint source-channel encoder further includes a series combination of N multiple description encoders followed by an entropy coder, wherein each of the N multiple description encoders includes a parallel arrangement of M multiple description encoders.

20. The apparatus of claim 19 wherein each of the M multiple description encoders implements one of: (i) a quantizer block followed by a transform block, (ii) a transform block followed by a quantizer block, (iii) a quantizer block with no transform block, and (iv) an identity function.

21. A method of decoding a signal received over a communication medium, comprising the steps of:

receiving encoded components of the signal over m channels of the medium, wherein the components are encoded utilizing a non-identity multiple description transform to produce at least n multiple description components each of which corresponds to a different output of the multiple description transform, and the resulting multiple description components are grouped into m groups of multiple description components for encoding and transmission over the m channels; and decoding the received encoded components of the signal in a multiple description decoder, wherein at least one of n and m is greater than two.

22. An apparatus for decoding a signal received over a communication medium, comprising:

a multiple description decoder for decoding encoded components of the signal received over m channels of the medium, wherein the components are encoded utilizing a non-identity multiple description transform to produce at least n multiple description components each of which corresponds to a different output of the multiple description transform, and the resulting multiple description components are grouped into m groups of multiple description components for encoding and transmission over the m channels, and wherein at least one of n and m is greater than two.

23. A method of encoding a signal for transmission, comprising the steps of:

encoding n components of the signal in a multiple description encoder for transmission over m channels, wherein the encoding step utilizes a non-identity multiple description transform to produce at least n multiple description components each of which corresponds to a different output of the multiple description transform, and the resulting multiple description components are grouped into n groups of multiple description components for encoding and transmission over the m channels, and wherein at least a subset of the m channels have probabilities of failure which are not independent of one another; and transmitting the encoded components of the signal.

24. An apparatus for encoding a signal for transmission, comprising:

a processor for processing the signal to form components thereof; and a multiple description encoder for encoding n components of the signal for transmission over m channels, wherein the encoding step utilizes a non-identity multiple description transform to produce at least n multiple description components each of which corresponds to a different output of the multiple description transform, and the resulting multiple description components are grouped into n groups of multiple description components for encoding and transmission over the m channels, and wherein at least a subset of the m channels have probabilities of failure which are not independent of one another.

* * * * *